United States Patent

[11] 3,629,018

[72] Inventors George A. Henderson
Richardson;
Gary E. Pittman, Dallas, both of Tex.

[21] Appl. No. 793,291
[22] Filed Jan. 23, 1969
[45] Patented Dec. 21, 1971
[73] Assignee Texas Instruments Incorporated
Dallas, Tex.

[54] PROCESS FOR THE FABRICATION OF LIGHT-EMITTING SEMICONDUCTOR DIODES
13 Claims, 10 Drawing Figs.

[52] U.S. Cl. .......... 148/187, 29/569, 29/576, 29/578, 148/188
[51] Int. Cl. .......... H01l 7/44
[50] Field of Search .......... 148/187, 188; 29/569, 576, 578

[56] References Cited

UNITED STATES PATENTS

| | | | |
|---|---|---|---|
| 3,255,056 | 6/1966 | Flatley et al. | 148/191 |
| 3,408,238 | 10/1968 | Sanders | 148/187 |
| 3,455,020 | 7/1969 | Dawson et al. | 148/187 |

*Primary Examiner*—L. Dewayne Rutledge
*Assistant Examiner*—R. A. Lester
*Attorneys*—James O. Dixon, Andrew M. Hassell, Harold Levine, Melvin Sharp, John E. Vandigriff, Henry T. Olsen, Michael A. Sileo, Jr. and Gary C. Honeycutt

ABSTRACT: A light-emitting semiconductor diode is made from an N-type crystal of GaAsP or GaP by the selective diffusion of zinc therein to form a PN junction. A special diffusion mask system is employed, to obtain a combination of direct diffusion into an unmasked region, and lateral diffusion beneath a selected portion of the mask. The major, active portion of the junction is formed by lateral diffusion, whereas that portion of the P-region formed by direct diffusion serves primarily as a preferred location for contact metallization.

INVENTOR
GEORGE A. HENDERSON
GARY E. PITTMAN

BY Gary C. Honeycutt
ATTORNEY

PROCESS FOR THE FABRICATION OF LIGHT-EMITTING SEMICONDUCTOR DIODES

This invention relates to the fabrication of radiant semiconductor diodes, and more particularly to the fabrication of planar, P-side-up, visible light-emitters from monocrystalline compound semiconductors, including gallium arsenide phosphide and gallium phosphide, for example.

Efficient light emission from forward-biased PN-junctions has been observed in a wide variety of direct band-gap semiconductor crystals, including particularly gallium arsenide, gallium antimonide, gallium phosphide, indium phosphide, indium arsenide and indium antimonide; and further including mixed crystals, such as gallium arsenide-phosphide, indium-gallium arsenide and indium phosphide-arsenide. The fabrication of a radiant diode from such a semiconductor crystal usually involves the selective diffusion of an acceptor impurity, such as zinc, into a crystal of N-type conductivity.

In certain applications, the resulting device is employed in a position such that the useful radiation is emitted through the region of N-type conductivity, to the substantial exclusion of any emission through the region of P-type conductivity. In such a case, relatively less attention is usually given to diffusion masking techniques, or to the control of diffusion conditions, since the light transmission character of the P-type region is relatively less important. For example, the accumulation of excess dopant on the surface of the semiconductor crystal during the diffusion operation is of minor concern, including whatever surface damage to the semiconductor crystal may result. On the other hand, when a radiant diode is to be employed "P-side-up," i.e., such that useful radiation is emitted primarily through the region of P-type conductivity, all these factors become critical to the external quantum efficiency of the device.

Phosphorus-doped silicon dioxide is a commonly employed diffusion mask in the fabrication of such diodes, due to its impermeability to zinc, a common acceptor impurity. The use of phosphorus-doped silicon dioxide as a diffusion mask on gallium arsenide, for example, has proven entirely satisfactory, insofar as its ability to sharply define the desired diffusion boundaries. However, the use of phosphorus-doped silicon dioxide as a zinc diffusion mask on gallium phosphide and gallium arsenide-phosphide has proven somewhat unsatisfactory, due to a highly exaggerated lateral diffusion of zinc along the interface between the diffusion mask and the semiconductor crystal, with the result that the boundaries of the diffused region are poorly defined. This phenomenon becomes particularly troublesome in the fabrication of high-density, monolithic diode arrays since a merging of adjacent PN-junctions frequently occurs, resulting in a serious reduction of production yields. Accordingly, there is a substantial incentive to develop improved zinc diffusion masks for use in the fabrication of gallium arsenide phosphide devices and gallium phosphide devices.

The lateral diffusion of zinc underneath a phosphorus-doped silicon dioxide mask on gallium arsenide phosphide or gallium phosphide extends far beyond any lateral diffusion predictable from theory, or predictable from previous experience with the fabrication of silicon devices when using silicon dioxide as a diffusion mask. Although such lateral outward diffusion is obviously undesirable, as observed, because it contributes to an undefined and/or poorly controlled junction geometry, the present invention is based in part upon the discovery that the peripheral portion of such a diffused junction, i.e., that portion which forms by lateral diffusion, is much brighter under forward bias than the remaining portions of the junction. An essential concept of the invention is to control the geometry of such lateral diffusion, and thereby to produce a device having a light-emissive junction formed primarily by lateral diffusion underneath such an oxide layer, which tends to maximize overall brightness and external quantum efficiency.

Accordingly, it is an object of the present invention to provide an improved method for the fabrication of a radiant semiconductor diode. It is a particular object of the invention to improve the boundary definition of a P-type diffused region, such as produced by the introduction of zinc impurity into an N-type semiconductor crystal, including gallium arsenide phosphide or gallium phosphide, for example.

It is a further object of the invention to provide a radiant semiconductor diode having increased brightness and increased external quantum efficiency. It is a more particular object to provide a monolithic array of light-emissive semiconductor diodes, and an improved method for the fabrication of such an array.

One aspect of the invention is embodied in a process for the selective diffusion of zinc into a semiconductor crystal of N-type conductivity selected from gallium phosphide-comprising and indium phosphide-comprising compounds. In addition to gallium phosphide and indium phosphide, mixed crystals are included, such as gallium arsenide-phosphide, gallium phosphide antimonide, indium arsenide-phosphide, indium-gallium phosphide, indium-gallium arsenide-phosphide, etc.

The selective diffusion mask comprises silicon nitride, deposited and patterned on the semiconductor crystal by known techniques. For example, the nitride is deposited by exposing the semiconductor crystal to a vaporous or gaseous mixture of ammonia and silane ($SiH_4$), diluted with $H_2$, at a temperature of about 700°–900° C. The deposited nitride is then patterned by photoresist masking and selective etching with dilute aqueous HF, to provide a window or windows therein defining a region or regions of the semiconductor crystal to be converted to P-type conductivity.

The nitride-masked crystal is then exposed at diffusion conditions, to a vaporous impurity source comprising zinc atoms, which may be supplied in the form of elemental zinc, or any suitable zinc-comprising compound, such as zinc arsenide, for a time sufficient to convert a portion of the crystal to P-type conductivity.

Another aspect of the invention is embodied in a process for the selective diffusion of a selected acceptor impurity, such as zinc, into a direct band-gap semiconductor crystal of N-type conductivity, by a combination of direct diffusion into an exposed portion of the crystal, and lateral diffusion along the interface between the crystal and a diffusion mask formed thereon. The preferred semiconductor crystals for use in accordance with this embodiment of the invention are the same as in the embodiment discussed above.

The preferred diffusion mask is phosphorus-doped silicon dioxide, which has been found to have the necessary combination of properties i.e., impermeability to zinc and/or zinc-comprising impurities, and a susceptibility for permitting lateral diffusion of such impurities along its interface with the semiconductor crystal surface. Accordingly, practice of this embodiment involves the formation and patterning of a phosphorus-doped silicon dioxide mask on a suitable semiconductor crystal, to provide therein a narrow opening, thereby exposing a portion of the crystal surface, and then subjecting the masked crystal to a suitable source of zinc atoms, at diffusion conditions, for a time sufficient to convert a portion of the crystal to P-type conductivity.

The narrow opening in the mask is preferably a circle, or annular groove, which provides a central mask portion small enough to permit lateral diffusion of the zinc extending underneath its entire area, thereby completing a single, continuous diffused region. Lateral diffusion of the zinc also occurs outward from the central portion of the mask, which provides a PN-junction having a diameter of about twice the diameter of the annular groove provided in the mask. The exposed area of the crystal receives the heaviest doping, and is used as a location for contact metallization.

The invention is also embodied in a method for the fabrication of a light-emissive semiconductor device beginning with the step of forming a first diffusion masking layer on a compound semiconductor crystal of N-type conductivity, said masking layer being substantially impermeable to a selected acceptor impurity, and being highly resistant to lateral diffusion of such impurity along the interface between the mask and the semiconductor crystal. The first masking layer is then patterned to provide therein a window defining an area of said crystal for intended conversion to P-type conductivity.

A second masking layer is then formed on the semiconductor crystal, within the window of the first masking layer, said second masking layer having a substantially less restrictive influence upon the diffusion of said selected acceptor impurity. That is, the second masking layer must either be permeable to the selected acceptor impurity, or substantially less resistant to lateral diffusion thereof along the interface between the mask and the semiconductor crystal; or both permeable to the impurity and less resistant to lateral diffusion.

Thereafter, with both the first and second masking layers in place, the crystal is exposed to the selected acceptor impurity, at diffusion conditions, for a time sufficient to cause conversion of a region of said crystal to P-type conductivity. In a preferred embodiment, such conversion to P-type conductivity occurs by a combination of direct diffusion into an exposed portion of the crystal, and concurrent lateral diffusion underneath the second masking layer.

The preferred semiconductor crystal for use in practicing the invention is a phosphide of gallium or indium, including mixed crystals of III–V compounds, such as gallium arsenide-phosphide, indium arsenide-phosphide, gallium-indium phosphide, indium antimonide-phosphide, and gallium antimonide-phosphide. Although practice of the invention with gallium arsenide and other III–V compounds is possible, the invention is primarily applicable to the phosphides since the phenomenon of lateral diffusion is very pronounced with the phosphides but occurs only to a negligible extent with gallium and other nonphosphide-containing III–V compounds. Particularly useful are monocrystalline gallium arsenide-phosphide and gallium phosphide. Monocrystalline gallium arsenide-phosphide is produced by any known technique, including, for example, epitaxial deposition upon a monocrystalline GaAs substrate having a (100) crystal orientation. The arsenic and phosphorus are supplied to the reaction zone as the corresponding hydrides diluted with hydrogen, whereas the gallium is supplied as gallium chloride, in an HC diluent. A deposition temperature of 1,100°–1,200° C. is used, and a time of about 4 hours is required to deposit a suitable thickness, for example, about 15 mils of GaAsP. Concurrently with the epitaxial growth, an amount of tin, sulfur, selenium or other suitable dopant is added, to provide a donor impurity level of about $10^{17}$ to $10^{18}$ atoms/cm.$^3$, preferably about $2\times10^{17}$ atoms/cm.$^3$. Similarly, monocrystalline gallium phosphide is also deposited epitaxially on GaAs by the same technique, with the omission of $AsH_3$ from the gases charged.

The preferred first diffusion masking layer is silicon nitride ($Si_3N_4$) which is substantially impermeable to zinc as a selected acceptor impurity. The silicon nitride is extremely resistant to lateral diffusion of zinc along the interface between the mask and the semiconductor crystal.

The silicon nitride masking layer is deposited on the semiconductor crystal by pyrolytic deposition, such as by the reaction of silane and ammonia at a temperature of about 700° to 900° C. in a hydrogen ambient. A silicon nitride thickness of 800 to 1,200 angstroms has been found preferable.

The silicon nitride is patterned by selective etching with the use of a photoresist masking layer such as KMER, marketed by the Eastman Kodak Company. A suitable etchant for removing the unwanted portions of a silicon nitride layer is an aqueous solution of HF, preferably buffered with ammonium fluoride. A temperature of about 60° C. is preferred for the etch step.

The preferred second diffusion masking layer is phosphorus-doped silicon dioxide formed, for example, by pyrolytic deposition from the reaction of tetraethylorthosilicate and phosphorus oxychloride or trimethyl phosphate in an oxidizing atmosphere. A phosphorus-doped silicon dioxide layer having a thickness of about 2,500 to 3,500 angstroms is desirable, preferably about 3,000 angstroms. By the use of known photoresist and selective etching techniques, the phosphorus-doped silicon dioxide layer is patterned within the silicon nitride window to expose only that portion thereof to be used for the formation of ohmic contacts to the P-type region, once formed. That is, the major, active portion of the PN-junction is formed by lateral diffusion underneath a phosphorus-doped silicon dioxide layer patterned within the nitride window.

The masked phosphide crystal is then subjected to zinc diffusion; for example, by sealing the crystal in an evacuated quartz ampul with a suitable amount of elemental zinc. The sealed ampul is then heated by any convenient means to about 925° C. for a period of 2 to 15 minutes to obtain a suitable conversion of the windowed region of the crystal to P-type conductivity. A surface concentration of Zn of about $10^{18}$ atoms/cm.$^3$ is preferred.

After the diffusion operation, the P-type region of the crystal is prepared for the attachment of suitable ohmic contacts. This preparation preferably includes the removal of the diffusion masking layers, followed by a deposition of fresh pyrolytic silicon oxide as a passivation medium, which is then again patterned by selective etching techniques to open the appropriate area for contact metallization, which preferably involves the evaporative deposition of a zinc-gold alloy. Ohmic contact with the N-type region is preferably made by the evaporative deposition of an antimony-gold alloy.

FIGURES 1–5

Figures 1, 2, 3, 4, 5, 6, 7, 8, 9, 10:
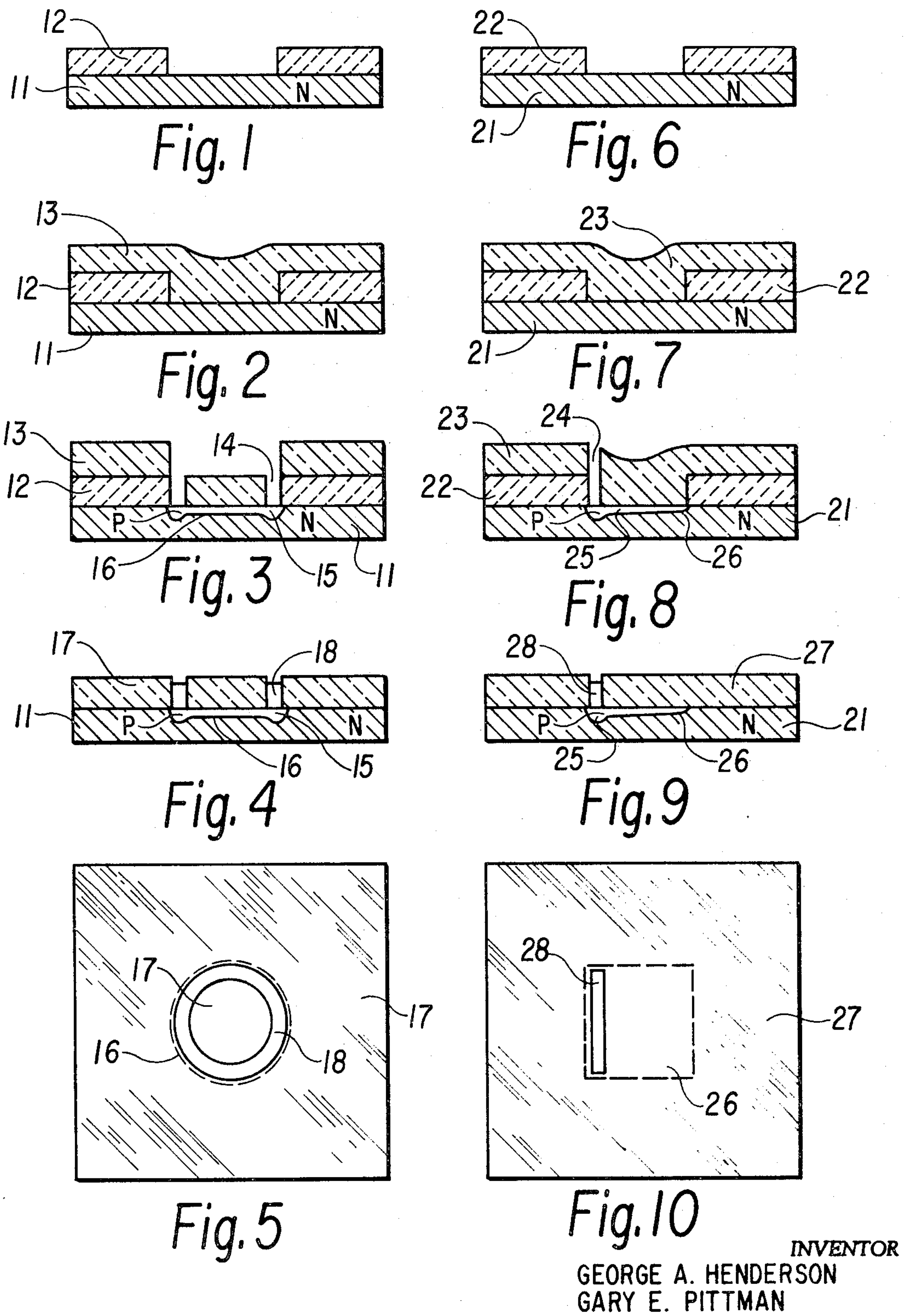
FIGS. 1–4 are cross sections of a GaAsP wafer, showing a sequence of steps employed in practicing one embodiment of the invention.
FIG. 5 is a top view of the structure shown in FIG. 4.
FIGS. 6–9 are cross sections of a GaAsP wafer, showing a sequence of steps employed in practicing another embodiment of the invention.
FIG. 10 is a top view of the structure of FIG. 9.

Wafer 11 consists of an N-type crystal of gallium arsenide-phosphide measuring about 25 mils square and having a thickness of about 10 mils. Masking layer 12 consists of silicon nitride applied to wafer 11 in accordance with known techniques including, for example, the pyrolytic reaction of silane plus ammonia, passed in contact with wafter 11 at deposition conditions, for a time sufficient to deposit a layer about 1,000 angstroms thick. A window is then provided in nitride layer 12, said window defining a region within wafer 11 to be converted to P-type conductivity by zinc diffusion. It has been discovered, in accordance with one aspect of the present invention, that silicon nitride is a particularly useful mask for the selective diffusion of zinc, due to its impermeability to zinc, and due to its unusually good adherence to gallium arsenide-phosphide wafter 11 and good adherence to other III–V phosphide-comprising crystal, thereby offering extreme resistance to lateral diffusion of zinc along the interface between the semiconductor wafer and the nitride layer.

As shown in FIG. 2, the structure of FIG. 1 is then covered with a layer 13 consisting of phosphorus-doped silicon dioxide, which may be deposited, for example, by the pyrolytic reaction of tetraethylorthosilicate and phosphorous oxychloride in an oxidizing atmosphere. Layer 13 is deposited to a thickness of 3,000 angstroms.

As shown in FIG. 3, layer 13 is then selectively etched using photoresist techniques and any suitable etchant, including, for example, dilute hydrofluoric acid, to form annular window 14, which has a diameter of 10 mils and a width of about one-half mil. The structure of FIG. 3 is then exposed to zinc vapors for the purpose of converting a portion of wafer 11 to P-type conductivity. Any suitable technique for the diffusion of zinc may be employed. It is preferred, however, to seal the wafer in an evacuated ampul containing 10 milligrams elemental zinc. The sealed, evacuated ampul is then heated to a temperature of about 925° C. for about 5 minutes to complete the diffusion operation and thereby generate PN-junction 16. That portion of the wafer lying immediately beneath window 14 is directly exposed to the zinc vapor and therefore becomes more heavily doped than that portion of the wafer lying below the central portion of masking layer 13. That is, the central portion of P-region 15 is more lightly doped because it is formed by exposure to only that concentration of zinc atoms which diffuses laterally along the interface between wafer 11 and the central portion of phosphorus-doped silicon dioxide layer 13.

Masking layers 12 and 13 are then removed from the surface of wafer 11 and replaced by the pyrolytic deposition of undoped silicon oxide layer 17. Ohmic connection to P-region 15 is then established by selectively etching an annular window in oxide layer 17 having the same location and dimensions as window 14 previously opened for the purpose of selective diffusion. Annular ohmic contact 18 is then formed by evaporative deposition of a suitable metal, for example, gold containing 0.6 percent zinc, thereby completing the structure shown in FIG. 4.

A top view of the completed structure is shown in FIG. 5, showing silicon oxide layer 17, metallic ring 18 and junction 16, indicated by a dashed line at the outer periphery of P-region 15.

As discussed above, it is also contemplated that a mask configuration similar to that shown in FIG. 3 may be used in which phosphorus-doped silicon dioxide is the sole masking layer, on either side of the annular window. Such a mask permits lateral diffusion both inwardly and outwardly from the annular window, and thereby provides no fixed control over the outer boundary of the resulting junction. Therefore, this embodiment is not preferred for the fabrication of diode arrays, or other applications where the outward spread of junction boundaries cannot be tolerated.

FIGURES 6–10

Wafer 21 consists of monocrystalline gallium arsenide-phosphide of N-type conductivity, having the same dimensions as wafer 11 described above. As shown in FIGS. 6 and 7, wafer 21 is coated first with a silicon nitride mask 22 having a suitable window therein for the selective diffusion of zinc, which is then covered by layer 23 of phosphorus-doped silicon dioxide, similarly as layers 12 and 13 shown in the embodiment of FIGS. 1–5.

As shown in FIG. 8, a portion of layer 23 is then removed by photoresist and selective etching techniques to provide linear slot 24 in preparation for the diffusion operation. The structure is then exposed to vaporous elemental zinc, at diffusion conditions, for a time sufficient to form region 25 of P-type conductivity which, in combination with the remaining portion of the substrate, forms PN-junction 26. That portion of junction 26 which lies immediately beneath slot 24 is more heavily doped and extends deeper into crystal 21 than the remaining portion of the junction, since that portion of P-region 25 which lies immediately below the central portion of layer 23 is formed by the lateral diffusion of zinc vapors along the interface between layer 23 and 21. In this embodiment, since the lateral diffusion proceeds only from left to right, it will be apparent that junction 26 becomes progressively more shallow with increased distance from slot 24.

As shown in FIG. 9, the structure of FIG. 8 is then modified by the removal of masking layers 22 and 23, which are replaced by silicon oxide layer 27. Ohmic contact is then established with region 25 by first opening a slot in layer 27 having the same location and dimensions as slot 24, followed by the evaporative deposition of a suitable contact metal 28, which is preferably a gold alloy containing a small amount of Zn, for example. A top view of the structure of FIG. 9 is shown in FIG. 10 with the boundary of P-region 25 indicated by dashed line 26.

Although the invention is primarily directed to P-side-up devices, as noted earlier, some benefit is also obtained with N-side-up devices. Accordingly, the proper scope of the invention includes both types of devices.

What is claimed is:

1. A method for the fabrication of a light-emitting device comprising:
   a. forming a first diffusion masking layer on a compound semiconductor crystal of N-type conductivity, said masking layer being substantially impermeable to a selected acceptor impurity, and highly resistant to lateral diffusion thereof along the interface between the mask and the semiconductor crystal;
   b. patterning said first masking layer to provide therein a window defining an area of said crystal for conversion to P-type conductivity;
   c. forming on said crystal, within said window, a second masking layer having a less restrictive influence on the diffusion of said selected acceptor impurity; and
   d. exposing the masked crystal to said selected acceptor impurity, at diffusion conditions, for a time sufficient to cause conversion of a portion of said crystal to P-type conductivity.

2. A method as defined by claim 1 wherein said first diffusion masking layer is silicon nitride.

3. A method as defined by claim 1 wherein said second diffusion masking layer is phosphorus-doped silicon dioxide.

4. A method as defined by claim 1 wherein said semiconductor crystal is selected from gallium phosphide and gallium arsenide-phosphide.

5. A method as defined by claim 1 wherein said selected acceptor impurity is zinc.

6. A method for the fabrication of a light-emitting device comprising:
   a. forming a first diffusion masking layer on a III–V compound semiconductor crystal of N-type conductivity, said masking layer being substantially impermeable to a selected acceptor impurity and highly resistant to lateral diffusion thereof along the interface between the mask and the semiconductor crystal;
   b. patterning said first masking layer to provide therein a window defining an area of said crystal for conversion to P-type conductivity;
   c. forming on said crystal, within said window, a second masking layer which is also substantially impermeable to said acceptor impurity, but which is substantially less resistant to lateral diffusion along the interface between the mask and the semiconductor crystal;
   d. patterning said second masking layer to cover only the major portion of said window, leaving a small portion of said crystal exposed;
   e. exposing the masked crystal to said selected acceptor impurity, at diffusion conditions, for a time sufficient to cause conversion of a region of said crystal to P-type conductivity by a combination of direct diffusion into the exposed portion of said crystal, and lateral diffusion under said second masking layer.

7. A method as defined by claim 6 wherein said first diffusion masking layer is silicon nitride.

8. A method as defined by claim 6 wherein said second diffusion mask is phosphorus-doped silicon dioxide.

9. A method as defined by claim 6 wherein said crystal is selected from gallium phosphide and gallium arsenide-phosphide.

10. A method as defined by claim 6 wherein said selected acceptor impurity comprises zinc.

11. A method for the fabrication of a semiconductor device comprising:
   a. depositing a silicon nitride masking layer on an N-type semiconductor crystal selected from gallium phosphide-comprising and indium phosphide-comprising compounds;
   b. patterning said masking layer to provide a window defining a region of said crystal to be converted to P-type conductivity;
   c. forming a silicon oxide layer on said crystal within the nitride window; and
   d. exposing said masked crystal to a vaporous impurity source comprising zinc atoms, at diffusion conditions, for a time sufficient to convert a portion of said crystal to P-type conductivity.

12. A method as defined by claim 11 wherein the area of said crystal defined by said nitride window is fully covered by silicon oxide.

13. A method as defined by claim 11 wherein only the major portion of the area of said crystal defined by the window is covered by silicon oxide, and a minor portion thereof is exposed directly to said source of zinc atoms.

* * * * *